United States Patent
Saxon

(10) Patent No.: US 8,875,079 B2
(45) Date of Patent: Oct. 28, 2014

(54) SYSTEM AND METHOD OF AUTOMATED DESIGN AUGMENTATION FOR EFFICIENT HIERARCHICAL IMPLEMENTATION

(75) Inventor: Douglas J. Saxon, Colorado Springs, CO (US)

(73) Assignee: LSI Corporation, San Jose, CA (US)

( * ) Notice: Subject to any disclaimer, the term of this patent is extended or adjusted under 35 U.S.C. 154(b) by 193 days.

(21) Appl. No.: 13/248,807

(22) Filed: Sep. 29, 2011

(65) Prior Publication Data

US 2013/0086540 A1 Apr. 4, 2013

(51) Int. Cl.
*G06F 17/50* (2006.01)
(52) U.S. Cl.
CPC ................... *G06F 17/5072* (2013.01)
USPC ........... 716/125; 716/105; 716/110; 716/111; 716/113; 716/134; 716/138
(58) Field of Classification Search
CPC  G06F 17/5045; G06F 17/505; G06F 17/5072
USPC ......... 716/104, 105, 110, 111, 113, 125, 132, 716/134, 138
See application file for complete search history.

(56) References Cited

U.S. PATENT DOCUMENTS

| | | | | |
|---|---|---|---|---|
| 5,831,869 A | * | 11/1998 | Ellis et al. | 716/103 |
| 5,907,494 A | * | 5/1999 | Dangelo et al. | 703/1 |
| 6,370,677 B1 | * | 4/2002 | Carruthers et al. | 716/121 |
| 6,567,967 B2 | * | 5/2003 | Greidinger et al. | 716/108 |
| 6,704,697 B1 | * | 3/2004 | Berevoescu et al. | 703/19 |
| 6,823,472 B1 | * | 11/2004 | DeKoning et al. | 714/10 |
| 6,857,116 B1 | | 2/2005 | Dahl et al. | |
| 7,093,265 B1 | * | 8/2006 | Jantz et al. | 719/321 |
| 7,143,367 B2 | * | 11/2006 | Eng | 716/102 |
| 7,159,196 B2 | * | 1/2007 | Anderson | 716/103 |
| 7,181,383 B1 | * | 2/2007 | McGaughy et al. | 703/14 |
| 7,376,919 B1 | | 5/2008 | McElvain et al. | |
| 7,568,176 B2 | * | 7/2009 | Jatkowski et al. | 716/125 |
| 7,614,020 B2 | * | 11/2009 | Mukund et al. | 716/128 |
| 7,685,545 B2 | * | 3/2010 | Chapman et al. | 716/136 |
| 7,823,116 B2 | * | 10/2010 | Chan | 716/104 |
| 7,852,117 B1 | * | 12/2010 | Lo et al. | 326/62 |
| 7,853,912 B2 | * | 12/2010 | Binder et al. | 716/113 |
| 7,987,086 B2 | * | 7/2011 | Van Huben et al. | 703/16 |
| 8,181,145 B2 | * | 5/2012 | Rice et al. | 716/134 |
| 8,209,649 B2 | * | 6/2012 | McIlrath | 716/110 |
| 8,220,006 B2 | * | 7/2012 | Eryilmaz | 719/328 |
| 8,234,615 B2 | * | 7/2012 | Ramji et al. | 716/129 |
| 8,239,805 B2 | * | 8/2012 | Rao et al. | 716/125 |
| 8,701,075 B2 | * | 4/2014 | Dartu et al. | 716/134 |
| 2007/0245281 A1 | * | 10/2007 | Riepe et al. | 716/9 |
| 2011/0035712 A1 | * | 2/2011 | Gaugler et al. | 716/105 |
| 2012/0151431 A1 | * | 6/2012 | Huijbregts et al. | 716/131 |

\* cited by examiner

*Primary Examiner* — Helen Rossoshek

(57) ABSTRACT

A hierarchical interface module includes an assessment unit configured to identify a hierarchical implementation incompatibility of an integrated circuit (IC) partitioned block. Additionally, the hierarchical interface module includes an interface unit configured to substitute a directly registered hierarchical interface structure for the hierarchical implementation incompatibility of the IC partitioned block. A method of interfacing hierarchically and a hierarchical implementation system are also included.

20 Claims, 5 Drawing Sheets

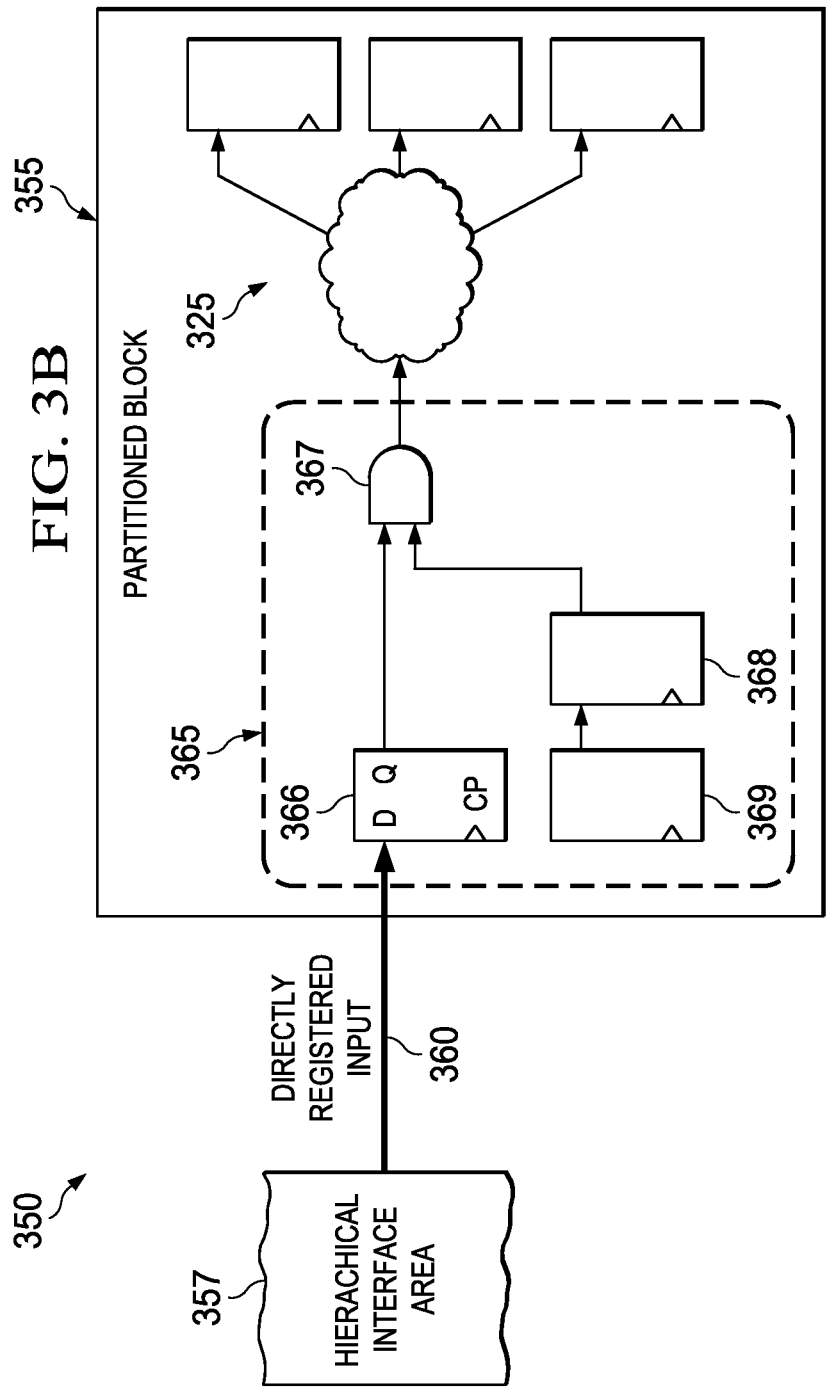

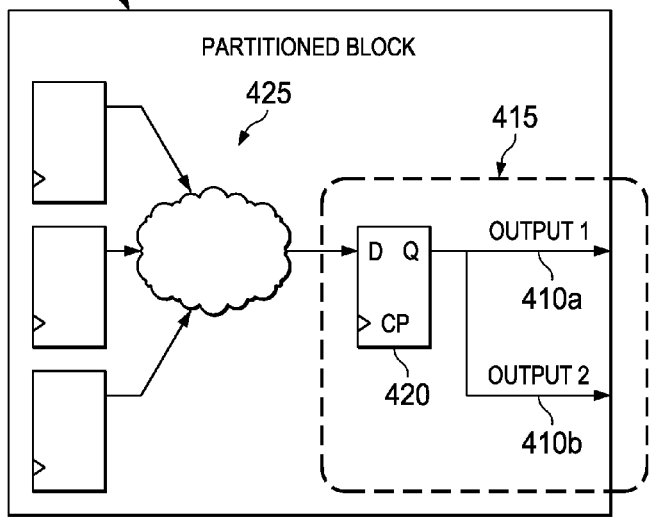
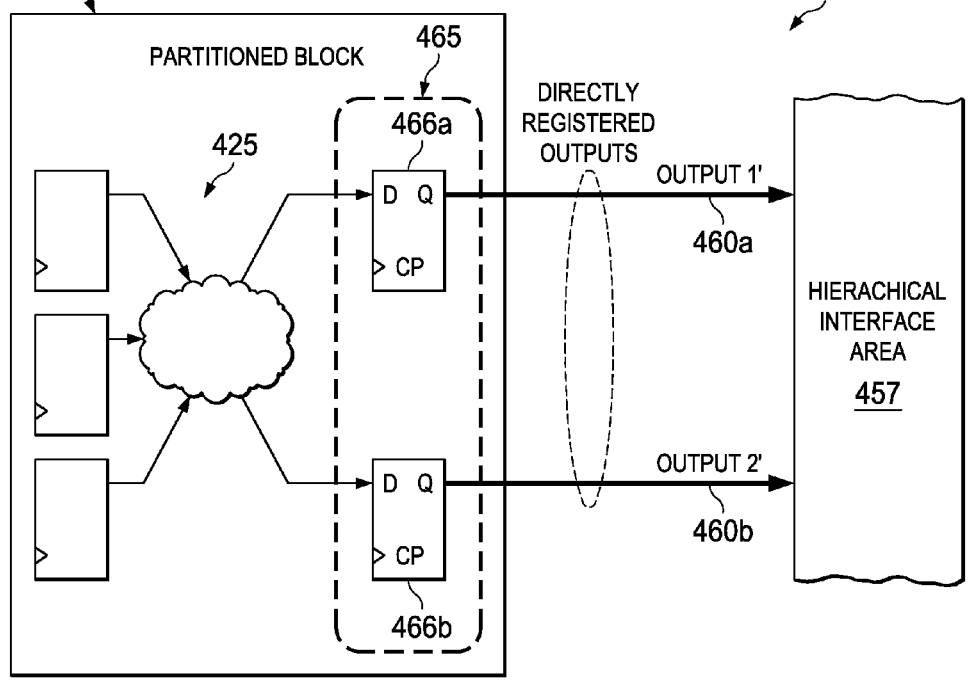

SYSTEM AND METHOD OF AUTOMATED DESIGN AUGMENTATION FOR EFFICIENT HIERARCHICAL IMPLEMENTATION

TECHNICAL FIELD

This application is directed, in general, to integrated circuit design and, more specifically, to a hierarchical interface module, a method of interfacing hierarchically and a hierarchical implementation system.

BACKGROUND

With the advent of System on Chip (SoC) designs, the growth of integrated circuit (IC) chip size has reached a level that necessitates automated circuit design assistance employing teams of designers. Each team of designers is typically responsible for independently designing a subsystem of the overall system that requires interfacing with the other subsystems on a hierarchical basis for the chip. In many cases, this hierarchical interfacing currently requires a circuit level determination of the impact of this hierarchical interfacing on the subsystem, thereby slowing the interfacing process and requiring a high level of designer knowledge about the subsystems. Improvements in this area would prove beneficial to the art.

SUMMARY

Embodiments of the present disclosure provide a hierarchical interface module, a method of interfacing hierarchically and a hierarchical implementation system.

In one embodiment, the hierarchical interface module includes an assessment unit configured to identify a hierarchical implementation incompatibility of an integrated circuit (IC) partitioned block. Additionally, the hierarchical interface module includes an interface unit configured to substitute a directly registered hierarchical interface structure for the hierarchical implementation incompatibility of the IC partitioned block.

In another aspect, the method of interfacing hierarchically includes identifying a hierarchical implementation incompatibility of an integrated circuit (IC) partitioned block and substituting a directly registered hierarchical interface structure for the hierarchical implementation incompatibility of the IC partitioned block.

In yet another aspect, the hierarchical implementation system includes an integrated circuit (IC) chip design having a partitioned block that requires hierarchical interfacing. Additionally, the hierarchical implementation system includes a hierarchical interface module having an assessment unit that identifies a hierarchical implementation incompatibility for the partitioned block, and an interface unit that substitutes a directly registered hierarchical interface structure for the hierarchical implementation incompatibility.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIG. 3B illustrates a hierarchical interface arrangement showing an embodiment of a directly registered hierarchical interface structure constructed according to the principles of the present disclosure;

FIG. 4A illustrates a diagram of a partitioned block having another example of a hierarchical implementation incompatibility;

FIG. 4B illustrates a hierarchical interface arrangement showing another embodiment of a directly registered hierarchical interface structure constructed according to the principles of the present disclosure;

DETAILED DESCRIPTION

Embodiments of this disclosure provide a hierarchical implementation strategy that first detects design obstacles to hierarchical implementation and then removes such obstacles by means of automated design changes that still maintain the original functional intent of the design. A particular focus of these embodiments is to quantify the suitability of each hierarchical boundary of a design for hierarchical implementation and improve it where appropriate by selecting and modifying the hierarchical boundary, where required, to be implemented independently as a hierarchical hard macro.

This means that each input of a partitioned block is directly captured by a register and each output of the block is directly launched by a register. This action isolates the internals of the block from the rest of the design so that the entire block can be independently implemented with minimal reliance on the rest of the design. This also makes it possible to build a very predictable model of the block so that the rest of the design can be implemented accurately.

Embodiments of the present disclosure may employ electronic design automation (EDA) tools. EDA tools are a category of computer aided design (CAD) tools and may be used to create representations of circuit configurations and the interconnections that couple them together. EDA tools allow verification, performance simulation and testing of designs using a computer without requiring the lengthy and costly process of fabrication. These embodiments may be carried out within a module that is part of an EDA tool running on a general purpose computer. In general, the embodiments discussed below may be performed by software running on a general purpose computer.

Figure 1:
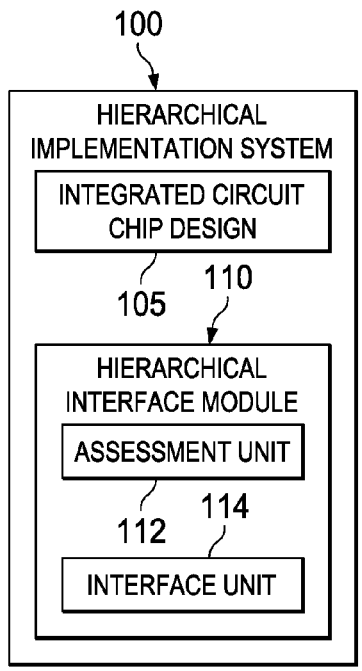
FIG. 1 illustrates a diagram of an embodiment of a hierarchical implementation system constructed according to the principles of the present disclosure.

FIG. 1 illustrates a diagram of an embodiment of a hierarchical implementation system, generally designated 100, constructed according to the principles of the present disclosure. The hierarchical implementation system 100 includes an integrated circuit (IC) chip design 105 and a hierarchical interface module 110. The hierarchical interface module includes an assessment unit 112 and a hierarchical interface module 114. The IC chip design typically employs multiple partitioned blocks that require hierarchical interfacing. The assessment unit 112 identifies hierarchical implementation incompatibilities for each partitioned block. Correspondingly, the interface unit 114 substitutes a directly registered hierarchical interface structure for each of the hierarchical implementation incompatibilities.

Generally, an assessment of each partitioned block in an IC chip design is performed, and interface pins that are already registered along with those that are not registered are identified. For those pins that are not registered, the assessment will classify each pin into a category based on its function and connectivity. If the pin falls into one of the categories described below, its connectivity is then modified appropriately. The result is a new design that is perfectly registered but with identical functional intent. This new design with newly registered interface connections is a better candidate for hierarchical implementation than the original design.

Figure 2:
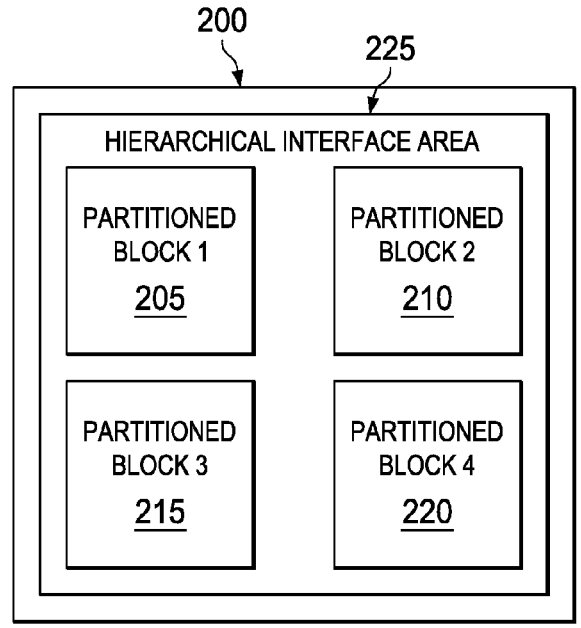
FIG. 2 illustrates an example of an IC chip design having partitioned blocks that require hierarchical interfacing constructed according to the principles of the present disclosure.

FIG. 2 illustrates an example of an IC chip design having partitioned blocks that require hierarchical interfacing, generally designate 200, constructed according to the principles of the present disclosure. The IC chip design 200 includes first, second, third and fourth partitioned blocks 205, 210, 215, 220 and a hierarchical interface area 225. Of course any number of partitioned blocks may be employed, as required by a particular design implementation.

Embodiments of the present disclosure replace incompatible partitioned blocks having hierarchical implementation incompatibilities with compatible partitioned blocks having directly registered hierarchical interface structures substituted for the hierarchical implementation incompatibilities. These directly registered hierarchical interface structures are implemented independently as hierarchical hard macros (i.e., a function for an IC chip that specifies how the required circuit elements are interconnected and also specifies the physical pathways and wiring patterns between the components).

Figure 3A:
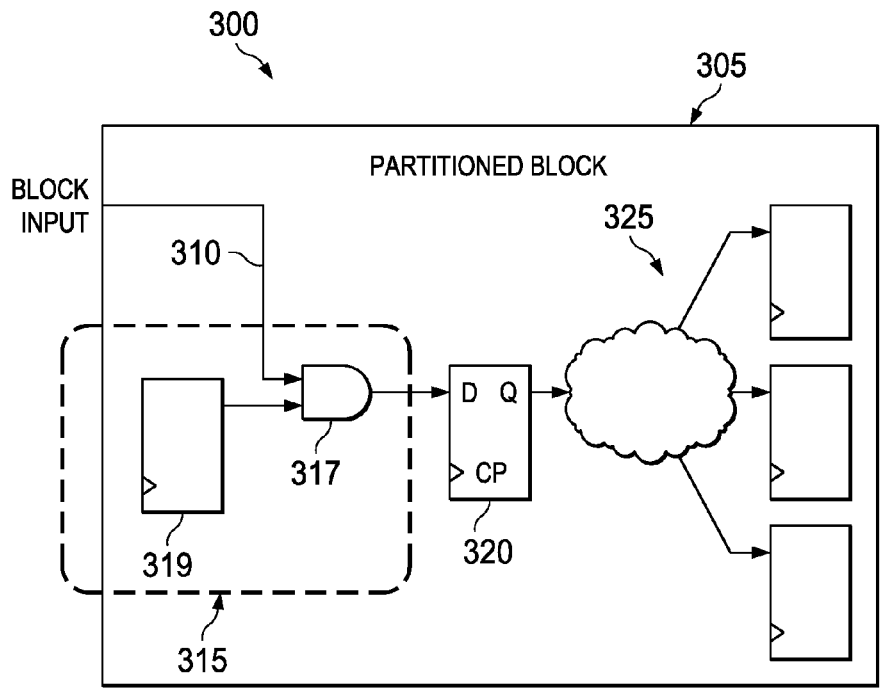
FIG. 3A illustrates a diagram of a partitioned block having an example of a hierarchical implementation incompatibility.

FIG. 3A illustrates a diagram of a partitioned block, generally designated 300, having an example of a hierarchical implementation incompatibility. The diagram 300 includes an incompatible partitioned block 305 having a block input 310 connected to an input hierarchical implementation incompatibility 315. The input hierarchical implementation incompatibility 315 includes combination logic consisting of a logic gate 317 and a clocking register 319 that occurs prior to an input capture register 320. The input capture register 320 drives other circuitry 325, as shown.

The block input 310 may be directly registered but is not independent. Due to an HDL coding style, it is qualified or encumbered by the combination logic consisting of a logic gate 317 and a clocking register 319 associated with or inserted prior to the input capture register 320. This is problematic for hierarchical implementation, since there is unresolved delay associated with the combinational logic that impacts operation of the block input 310 and the input capture register 320.

FIG. 3B illustrates a hierarchical interface arrangement, generally designated 350, showing an embodiment of a directly registered hierarchical interface structure constructed according to the principles of the present disclosure. The directly registered hierarchical interface structure is a capturing structure that removes the hierarchical implementation incompatibility of the partitioned block of FIG. 3A.

The hierarchical interface 350 includes a compatible partitioned block 355 connected to a hierarchical interface area 357 through a directly registered input 360. The compatible partitioned block 355 includes a directly registered hierarchical interface input structure 365 having a capture register 366 connected to the directly registered input 360, combination logic consisting of a logic gate 367 and a clocking register 368 connected to an output of the capture register 366. The directly registered hierarchical interface input structure 365 also includes another clocking register 369 connected to an input of the clocking register 368.

Here, the capture register 366 employs independent and direct access to the hierarchical interface area 357 through the directly registered input 360. Additionally, placement of the logic gate 367 and the clocking register 368 employs an isolated output from the capture register 366 as compared to the logic gate 317 and the clocking register 319 of FIG. 3A that occur prior to the input capture register 320. The clocking register 369 provides an additional clock delay needed to maintain accurate circuit functionality. The directly registered hierarchical interface input structure 365 (i.e., the logic gate 367) drives the other circuitry 325, as shown. This embodiment of the directly registered hierarchical interface structure provides independent, directly registered hierarchical interfacing between for an input to a partitioned block of an IC chip design.

FIG. 4A illustrates a diagram of a partitioned block, generally designated 400, having another example of a hierarchical implementation incompatibility. The diagram 400 includes an incompatible partitioned block 405 having multiple block outputs 410a, 410b connected to create an output hierarchical implementation incompatibility 415. The output hierarchical implementation incompatibility 415 includes a launching register 420 that provides the multiple block outputs 410a, 410b. An output from other circuitry 425 provides an input to the launching register 420, as shown.

The multiple block outputs 410a, 410b may be directly registered but are not independent. This is also problematic for hierarchical implementation, since placement of the multiple block outputs 410a, 410b is generally burdened due to having to keep each output pin (connection) localized to its other associated output pins.

FIG. 4B illustrates a hierarchical interface arrangement, generally designated 450, showing another embodiment of a directly registered hierarchical interface structure constructed according to the principles of the present disclosure. The directly registered hierarchical interface structure is a launching structure that removes the hierarchical implementation incompatibility of the partitioned block of FIG. 4A. The hierarchical interface 450 includes a compatible partitioned block 455 connected to a hierarchical interface area 457 through multiple directly registered outputs 460a, 460b. The compatible partitioned block 455 includes a directly registered hierarchical interface output structure 465 having multiple launch registers 466a, 466b respectively connected to the multiple directly registered outputs 460a, 460b.

Here, the multiple launch registers 466a, 466b employ independent and direct access to the hierarchical interface area 457 through the multiple directly registered outputs 460, 460b. The other circuitry 425 provides inputs to the multiple launch registers 466a, 466b, as shown. This embodiment of the directly registered hierarchical interface structure provides independent, directly registered hierarchical interfacing for multiple outputs of a partitioned block of an IC chip design.

Figure 5A:
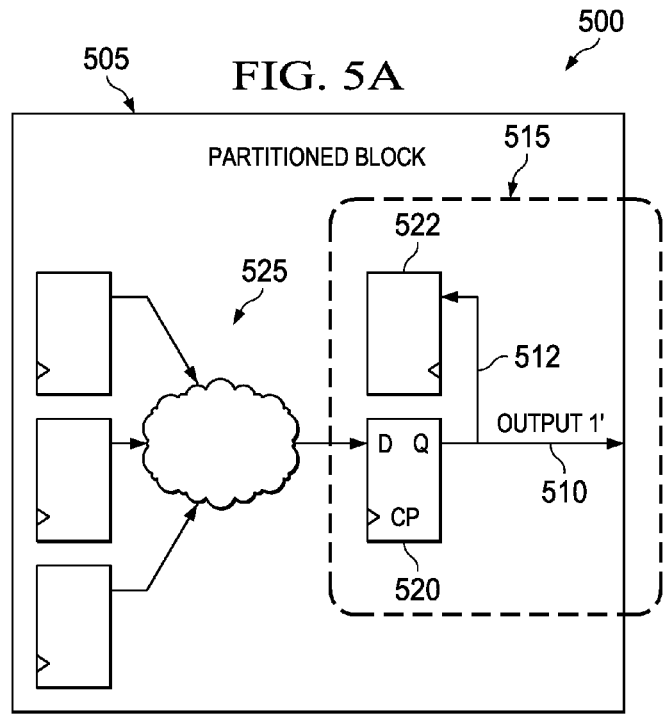
FIG. 5A illustrates a diagram of a partitioned block having yet another example of a hierarchical implementation incompatibility.

FIG. 5A illustrates a diagram of a partitioned block, generally designated 500, having yet another example of a hierarchical implementation incompatibility. The diagram 500 includes an incompatible partitioned block 505 having a block output 510 connected to create output an output hierarchical implementation incompatibility 515. The output hierarchical implementation incompatibility 515 includes a launching register 520 that provides the block output 510 and a feedback path 512 that feeds back an output signal from the launching register 520 to a feedback register 522, which represents additional internal circuitry on the incompatible partitioned block 505. An output from other circuitry 525 provides an input to the launching register 520, as shown.

The block output 510 may be directly registered but is not independent. This is again problematic for hierarchical implementation, since placement of the block output 510 is generally burdened due to having to keep it localized to the feedback path 512.

Figure 5B:
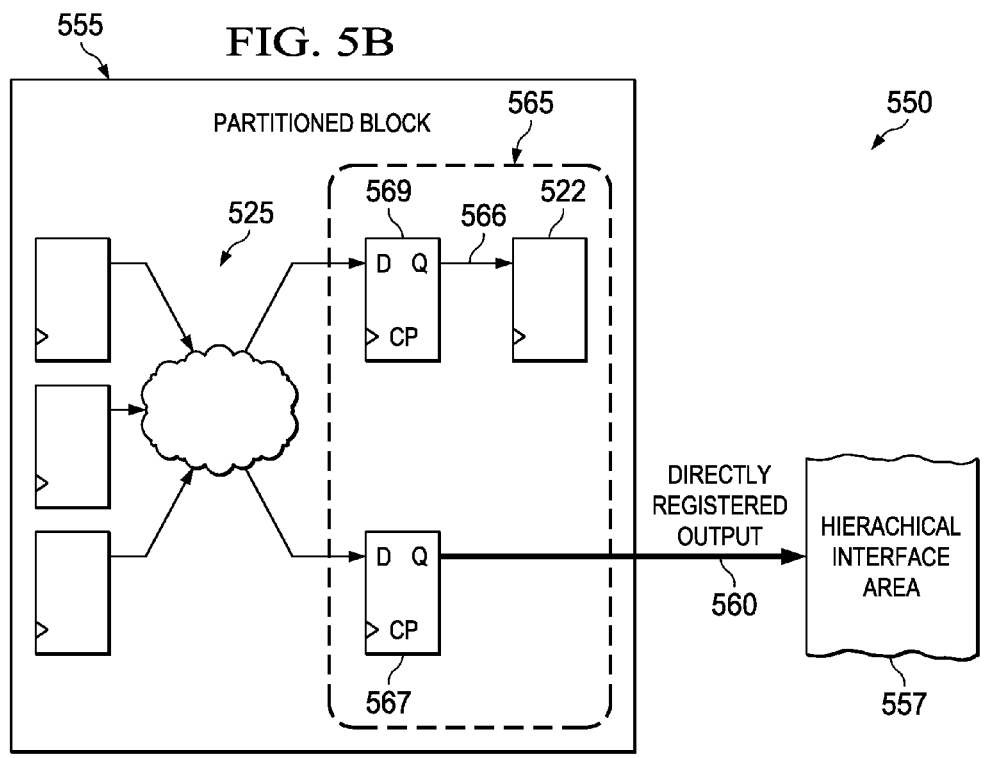
FIG. 5B illustrates a hierarchical interface arrangement showing yet another embodiment of a directly registered hierarchical interface structure constructed according to the principles of the present disclosure.

FIG. 5B illustrates a hierarchical interface arrangement, generally designated 550, showing yet another embodiment of a directly registered hierarchical interface structure constructed according to the principles of the present disclosure. The directly registered hierarchical interface structure is a launching structure that removes the hierarchical implementation incompatibility of the partitioned block of FIG. 5A. The hierarchical interface 550 includes a compatible partitioned block 555 connected to a hierarchical interface area 557 through a directly registered output 560.

The compatible partitioned block 555 includes a directly registered hierarchical interface output structure 565 having a launch register 567 connected to the directly registered output 560. The directly registered hierarchical interface output structure 565 also has an additional register 569 connected to the feedback register 522 through a feedback connection 566. Parallel outputs from the other circuitry 525 provide a same output signal to inputs of the launch register 567 and the additional register 569. In general, this embodiment of the directly registered hierarchical interface structure provides independent, directly registered hierarchical interfacing for a block output of a partitioned block of an IC chip design.

Figure 6:
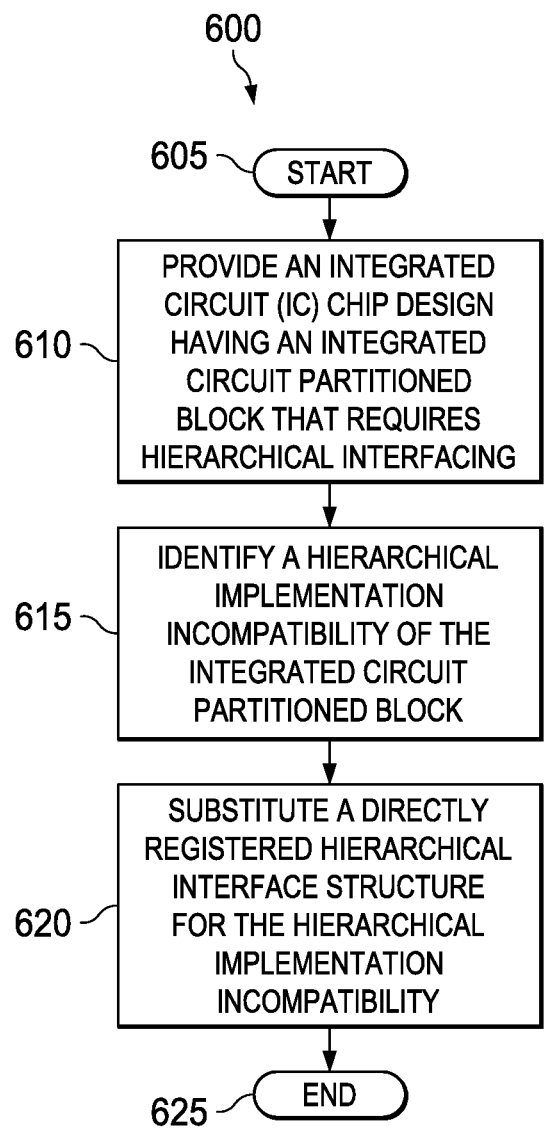
FIG. 6 illustrates an embodiment of a flow diagram of a method of interfacing hierarchically carried out according to the principles of the present disclosure.

FIG. 6 illustrates an embodiment of a flow diagram of a method of interfacing hierarchically, generally designated 600, carried out according to the principles of the present disclosure. The method 600 starts in a step 605, and an integrated circuit (IC) chip design having a partitioned block that requires hierarchical interfacing is provided, in a step 610. Then, a hierarchical implementation incompatibility of the IC partitioned block is identified in a step 615, and in a step 620, a directly registered hierarchical interface structure is substituted for the hierarchical implementation incompatibility of the IC partitioned block. Generally, the directly registered hierarchical interface structure is a launching structure or a capturing structure and is implemented independently as a hierarchical hard macro.

In one embodiment, the directly registered hierarchical interface structure is substituted for an input having intermediate enabling circuitry to a capture register. In another embodiment, the directly registered hierarchical interface structure is substituted for a launch register driving multiple outputs. Accordingly, the directly registered hierarchical interface structure substitution requires an adjustment of clock timing for at least a portion of the IC partitioned block. In yet another embodiment, the directly registered hierarchical interface structure is substituted for a launch register having output feedback to other circuitry on the IC partitioned block. The method 600 ends in a step 625.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A hierarchical interface module embodied on a non-transitory computer readable medium that directs operation of a processor when initiated, comprising:
   an assessment unit configured to identify an internal structure of a partitioned block of an integrated circuit (IC) that is incompatible with a hierarchical implementation of the IC; and
   an interface unit configured to substitute within the partitioned block a directly registered hierarchical interface structure for the internal structure identified as incompatible, wherein the directly registered hierarchical interface structure includes at least one input structure which directly corresponds to at least one output structure within the partitioned block or at least one output structure which directly corresponds to at least one input structure within the partitioned block.

2. The module as recited in claim 1 wherein the directly registered hierarchical interface structure is a launching structure or a capturing structure.

3. The module as recited in claim 1 wherein the directly registered hierarchical interface structure is substituted for an input having intermediate enabling circuitry to a capture register.

4. The module as recited in claim 1 wherein the directly registered hierarchical interface structure is substituted for a launch register driving multiple outputs.

5. The module as recited in claim 1 wherein the directly registered hierarchical interface structure substitution requires an adjustment of clock timing for at least a portion of the IC partitioned block.

6. The module as recited in claim 1 wherein the directly registered hierarchical interface structure is substituted for a launch register having output feedback to other circuitry on the IC partitioned block.

7. The module as recited in claim 1 wherein the directly registered hierarchical interface structure is implemented independently as a hierarchical hard macro.

8. A method of interfacing hierarchically, comprising:
   identifying an internal structure of a partitioned block of an integrated circuit (IC) that is incompatible with a hierarchical implementation of the IC; and
   substituting within the portioned block a directly registered hierarchical interface structure for the internal structure identified as incompatible employing a processor, wherein the directly registered hierarchical interface structure includes at least one input structure which directly corresponds to at least one output structure within the partitioned block or at least one output structure which directly corresponds to at least one input structure within the partitioned block.

9. The method as recited in claim 8 wherein the directly registered hierarchical interface structure is a launching structure or a capturing structure.

10. The method as recited in claim 8 wherein the directly registered hierarchical interface structure is substituted for an input having intermediate enabling circuitry to a capture register.

11. The method as recited in claim 8 wherein the directly registered hierarchical interface structure is substituted for a launch register driving multiple outputs.

12. The method as recited in claim 8 wherein the directly registered hierarchical interface structure substitution requires an adjustment of clock timing for at least a portion of the IC partitioned block.

13. The method as recited in claim 8 wherein the directly registered hierarchical interface structure is substituted for a launch register having output feedback to other circuitry on the IC partitioned block.

14. The method as recited in claim 8 wherein the directly registered hierarchical interface structure is implemented independently as a hierarchical hard macro.

15. A hierarchical implementation system, comprising:
    an integrated circuit (IC) chip design having a partitioned block that requires hierarchical interfacing; and
    a hierarchical interface module embodied on a non-transitory computer readable medium that directs operation of a processor when initiated, including:
        an assessment unit that identifies an internal structure of a partitioned block of said IC that is incompatible with a hierarchical implementation, and
        an interface unit that substitutes within the partitioned block a directly registered hierarchical interface structure for the internal structure identified as incompatible, wherein the directly registered hierarchical interface structure includes at least one input structure which directly corresponds to at least one output structure within the partitioned block or at least one output structure which directly corresponds to at least one input structure within the partitioned block.

16. The system as recited in claim 15 wherein the directly registered hierarchical interface structure is a launching structure or a capturing structure.

17. The system as recited in claim 15 wherein the directly registered hierarchical interface structure is substituted for an input having intermediate enabling circuitry to a capture register.

18. The system as recited in claim 15 wherein the directly registered hierarchical interface structure is substituted for a launch register driving multiple outputs.

19. The system as recited in claim 15 wherein the directly registered hierarchical interface structure substitution requires an adjustment of clock timing for at least a portion of the IC partitioned block.

20. The system as recited in claim 15 wherein the directly registered hierarchical interface structure is substituted for a launch register having output feedback to other circuitry on the IC partitioned block.

* * * * *